(12) United States Patent
Pieralisi et al.

(10) Patent No.: US 11,901,477 B2
(45) Date of Patent: Feb. 13, 2024

(54) LIGHT ABSORBING BARRIER FOR LED FABRICATION PROCESSES

(71) Applicant: Applied Materials, Inc., Santa Clara, CA (US)

(72) Inventors: Fabio Pieralisi, Aschaffenburg (DE); Mingwei Zhu, San Jose, CA (US); Zihao Yang, Cupertino, CA (US); Liang Zhao, Gilroy, CA (US); Jeffrey L. Franklin, Santa Cruz, CA (US); Hou T. Ng, Campbell, CA (US); Nag Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/350,523

(22) Filed: Jun. 17, 2021

(65) Prior Publication Data

US 2022/0406960 A1   Dec. 22, 2022

(51) Int. Cl.
| | |
|---|---|
| *H01L 33/00* | (2010.01) |
| *H01L 25/075* | (2006.01) |
| *H01L 33/06* | (2010.01) |
| *H01L 33/32* | (2010.01) |
| *H01L 33/46* | (2010.01) |

(Continued)

(52) U.S. Cl.
CPC ...... *H01L 33/0093* (2020.05); *H01L 25/0753* (2013.01); *H01L 33/007* (2013.01); *H01L 33/06* (2013.01); *H01L 33/32* (2013.01); *H01L 33/46* (2013.01); *H01L 33/50* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2016/0126224 A1 | 5/2016 | Lee et al. | |
| 2017/0345801 A1* | 11/2017 | Lin | H01L 25/075 |
| 2019/0267426 A1 | 8/2019 | Zou et al. | |

FOREIGN PATENT DOCUMENTS

| | | | | |
|---|---|---|---|---|
| CN | 103151438 A | * | 6/2013 | H01L 33/38 |
| KR | 10-1539591 B1 | | 7/2015 | |

(Continued)

OTHER PUBLICATIONS

International Search Report and Written Opinion dated Sep. 27, 2022 in International Patent Application No. PCT/US2022/031858, 11 pages.

*Primary Examiner* — Robert K Carpenter
(74) *Attorney, Agent, or Firm* — Kilpatrick Townsend & Stockton LLP

(57) ABSTRACT

Exemplary processing methods include forming a group of LED structures on a substrate layer to form a patterned LED substrate. A light absorption barrier may be deposited on the patterned LED substrate. The methods may further include exposing the patterned LED substrate to light. The light may be absorbed by surfaces of the LED structures that are in contact with the substrate layer, and the light absorption barrier. The methods may still further include separating the LED structures for the substrate layer. The bonding between the LED structures and the substrate layer may be weakened by the absorption of the light by the surfaces of the LED structures in contact with the substrate layer.

20 Claims, 6 Drawing Sheets

(51) Int. Cl.
*H01L 33/50* (2010.01)
*H01L 33/62* (2010.01)

(56) References Cited

FOREIGN PATENT DOCUMENTS

| | | | |
|---|---|---|---|
| KR | 10-1876008 | B1 | 7/2018 |
| KR | 10-2020-0128987 | A | 11/2020 |

* cited by examiner

LIGHT ABSORBING BARRIER FOR LED FABRICATION PROCESSES

TECHNICAL FIELD

The present technology relates to semiconductor processes and products. More specifically, the present technology relates to producing semiconductor structures and the devices formed.

BACKGROUND

Light-emitting-diode (LED) display devices made from millions of micron-sized pixels are made possible by fabrication processes that produce intricately patterned material layers on substrate surfaces. Producing patterned material on a substrate requires controlled methods for deposition and removal of materials. However, with new device designs, producing high-quality layers of material with very precise dimensions may be challenging.

Thus, there is a need for improved systems and methods that can be used to produce high-quality materials and structures for LED display devices. These and other needs are addressed by the present technology.

SUMMARY

The present technology includes exemplary semiconductor processing methods that include forming a group of LED structures on a substrate layer to form a patterned LED substrate. A light absorption barrier may be deposited on the patterned LED substrate. The methods may further include exposing the patterned LED substrate to light. The light may be absorbed by surfaces of the LED structures that are in contact with the substrate layer and the light absorption barrier. The methods may still further include separating the LED structures of the substrate layer. The bonding between the LED structures and the substrate layer may be weakened by the absorption of the light by the surfaces of the LED structures in contact with the substrate layer.

In additional embodiments, the group of LED structures may include gallium-and-nitrogen-containing material that generates nitrogen gas ($N_2$) when exposed to the light at the surfaces of the LED structures in contact with the substrate layer. In further embodiments, the substrate may include sapphire (i.e., $Al_2O_3$). In still further embodiments, the light exposing the LED substrate may be characterized by a peak intensity wavelength that is less than or about 300 nm. In yet additional embodiments, the light absorption barrier may include one or more layers of dielectric material. In still additional embodiments, the dielectric material may be characterized by a room-temperature bandgap of greater than or about 4.3 eV. In still further embodiments, the light absorption barrier is operable to transmit light emitted from the LED structures. In more embodiments, the semiconductor further includes a backplane substrate bonded to the group of LED structures opposite the substrate layer. In still more embodiments, the light absorption barrier prevents the light exposing the patterned LED substrate from reaching the backplane substrate.

The present technology also includes additional semiconductor processing methods that may include forming an LED structure on a substrate layer. The methods may further include forming a first portion of a light absorption barrier on the LED structure and the substrate layer, and forming at least one additional portion of the light absorption barrier on the first portion of the light absorption barrier. The method may still further include exposing the substrate layer to ultraviolet light, where the ultraviolet light is absorbed by exposed portions of the light absorption barrier. Following the exposure, the LED structure may be separated from the substrate layer.

In additional embodiments, the first portion of the light absorption barrier may include a first dielectric material selected from the group that includes silicon oxide, silicon nitride, titanium oxide, titanium nitride, germanium oxide, tantalum oxide, tantalum nitride, manganese oxide, niobium oxide, antimony oxide, indium-tin-oxide, lanthanum oxide, yittrium oxide, zirconium oxide, aluminum oxide, aluminum nitride, hafnium oxide, and magnesium fluoride. In further embodiments, the at least one additional portion of the light absorption barrier includes a second portion that includes a second dielectric material that is different than the first dielectric material. In still further embodiments, the ultraviolet light is characterized by a wavelength less than or about 300 nm. In yet additional embodiments, the method further includes forming a reflective layer on the light absorption barrier. In more embodiments, the light absorption barrier increases a percentage reflectance of the reflective layer for LED light emitted by the LED structure.

The present technology further includes semiconductor structures that may include a plurality of LED structures, a backplane layer, and a light barrier region positioned between the LED structures and the backplane layer. The light barrier region may be operable to absorb light at wavelengths shorter than or about 300 nm and transmit light at wavelengths greater than or about 350 nm.

In additional embodiments, the plurality of LED structures may each include an n-doped gallium-and-nitrogen-containing region, multi-quantum-well layers in contact with the n-doped gallium-and-nitrogen-containing region, and a p-doped gallium-and-nitrogen-containing region in contact with the multi-quantum-well layers. In further embodiments, the backplane layer may include an ultraviolet-light-absorbing polymer. In yet further embodiments, the light barrier region may include two or more layers of dielectric material selected from the group that includes silicon oxide, silicon nitride, titanium oxide, titanium nitride, germanium oxide, tantalum oxide, tantalum nitride, manganese oxide, and niobium oxide, where a first layer of dielectric material is different than a second layer of dielectric material in contact with the first layer of dielectric material. In still additional embodiments, the semiconductor structure may further include a reflective layer in contact with the light barrier region. In more embodiments, the semiconductor structure further includes a light-conversion region in contact with at least one of the LED structures, where the light conversion region is operable to absorb light generated by the LED structures and emit converted light characterized by a longer peak wavelength intensity.

Such technology may provide numerous benefits over conventional semiconductor processing methods and structures. For example, embodiments of the processing methods may reduce the amount of short-wavelength light absorbed by a backplane substrate during the irradiation of a patterned LED substrate to separate the substrate layer bonded opposite the backplane substrate. This reduces damage to the control circuitry in the backplane substrate caused by the short-wavelength, ionizing light used to separate the substrate layer. In further embodiments, the processing methods form a light absorption barrier that blocks damaging short-wavelength radiation from reaching a backplane substrate and increases the extraction of light generated by the LED structures in a useful direction. These and other embodi-

BRIEF DESCRIPTION OF THE DRAWINGS

A further understanding of the nature and advantages of the disclosed technology may be realized by reference to the remaining portions of the specification and the drawings.

Figure 1:
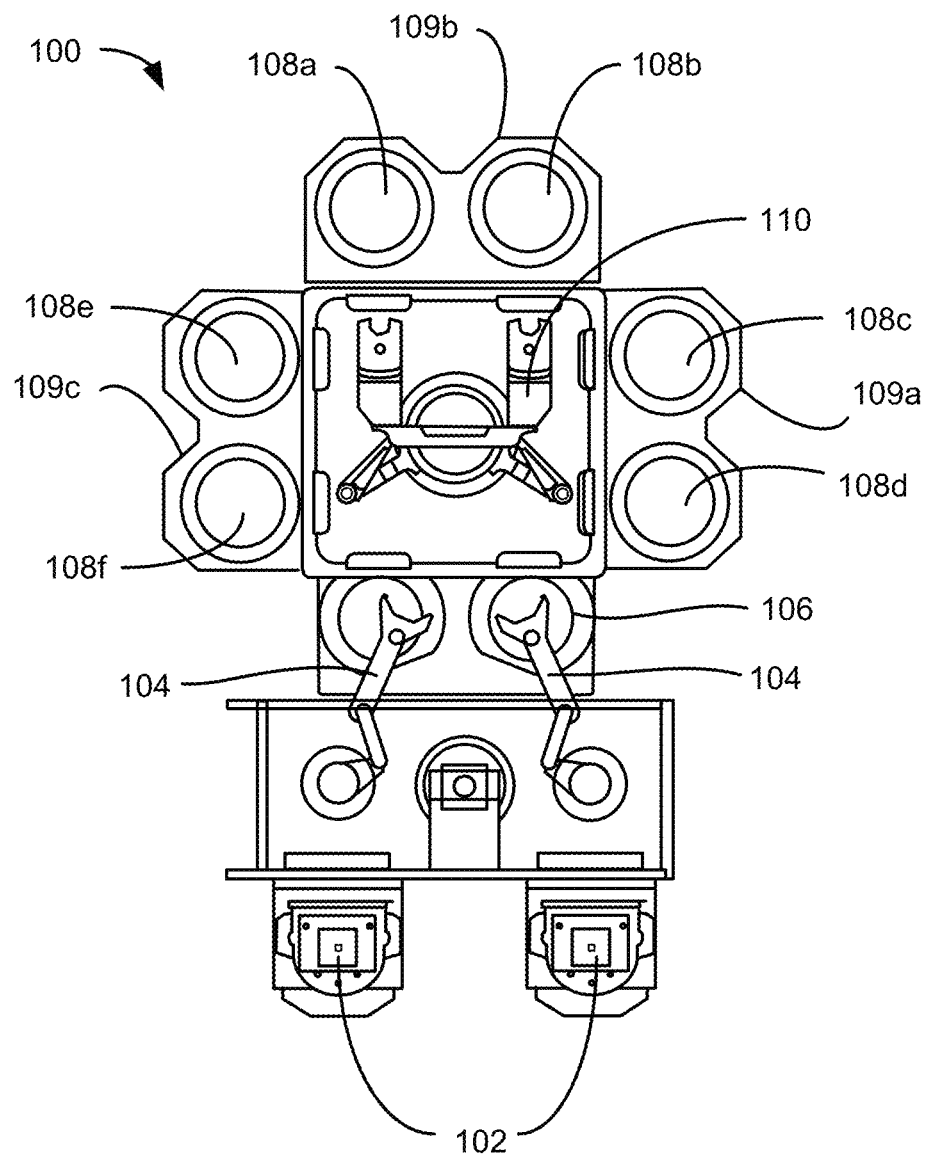
FIG. 1 shows a top plan view of one embodiment of an exemplary processing system according to some embodiments of the present technology.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

An LED display normally includes LED structures that illuminate the display's pixels and a backplane substrate that includes control circuitry to address and activate the pixels. In many fabrication processes, the LED structures are formed on an LED substrate, while the control circuitry is formed on a separate backplane substrate. The two substrates are then joined together to form a LED display structure. In many instances, the LED substrate is removed from the display structure and replaced by additional structures that covert the color and change the emission pattern of the light emitted by the underlying LED structures.

One technique for removing the LED substrate from the display structure is laser liftoff that uses energetic light to photodissociate the bonding between the LED substrate and the underlying LED structures, which include layers of LED materials. For example, ultraviolet light from an excimer or solid-state laser may be used to photodissociate the bonding between a sapphire LED substrate and the interfacing gallium nitride-containing base regions of LED structures formed on the sapphire substrate. The ultraviolet light passes through the sapphire and photodissociates the gallium nitride into liquid gallium metal and nitrogen ($N_2$) gas. As more gallium nitride photodissociates, the bonding between the sapphire substrate and the LED structures weaken while the increasing pressure of the nitrogen gas pushes the layers apart until a complete separation occurs.

Laser liftoff is a clean and efficient technique for separating the LED substrate from the LED structures, but it has a significant drawback: the highly energetic ultraviolet light can escape through the gaps between adjacent LED structures and damage the underlying backplane substrate. In many instances, the damage caused by the UV light can cause failures in the control circuit of the backplane substrate that results in dead or mistimed activation of one or more pixels in the LED display. In additional instances, the UV light can damage polymers formed between the LED structures that assist in bonding the structures to a temporary carrier substrate that is eventually replaced with a backplane substrate. The photo-damaged polymers can form permanent areas of contamination between LED structures that can discolor and distort the images displayed by the device.

Embodiments of the present technology address problems caused by escaped UV light that damages backplane substrates and other regions on an LED display during a laser liftoff operation to remove an LED substrate from the LED structures formed on the substrate. In embodiments, the present technology includes processes to form a light absorption barrier on the LED structures and substrate layer of a patterned LED substrate. The light absorption barrier is operable to absorb energetic light from the laser liftoff operation and prevent it from reaching exposed areas of a backplane substrate between adjacent LED structures.

Additional embodiments of the present technology include processes to form a light absorption barrier between LED structures and a reflective layer that reflects light emitted by the LED structure in a useful direction for the LED display. In embodiments, the light absorption barrier can absorb more energetic ultraviolet light generated during a laser liftoff operation while transmitting less energetic ultraviolet light and visible light generated by an LED structure. In further embodiments, the light absorption barrier can increase the reflectance of the reflective layer for light generated by an LED structure.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations, including the physical vapor deposition processes described herein, in addition to dry etch processes, cyclical layer deposition processes, atomic layer deposition processes, chemical vapor deposition processes including metal-organic chemical vapor deposition processes, etch processes, pre-clean processes, planarizing processes including chemical-mechanical-polishing processes, anneal processes, plasma processing processes, degas processes, orientation processes, and other semiconductor fabrication processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to planarize, anneal, cure, or treat the deposited films. In another configuration, all three pairs of chambers, for example 108a-f, may be configured to both deposit and cure a film on the substrate. One or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems that may provide access to multiple processing chambers while maintaining a vacuum environment in various sections, such as the noted holding and transfer areas, may allow operations to be performed in multiple chambers while maintaining a particular vacuum environment between discrete processes.

Figure 2A:
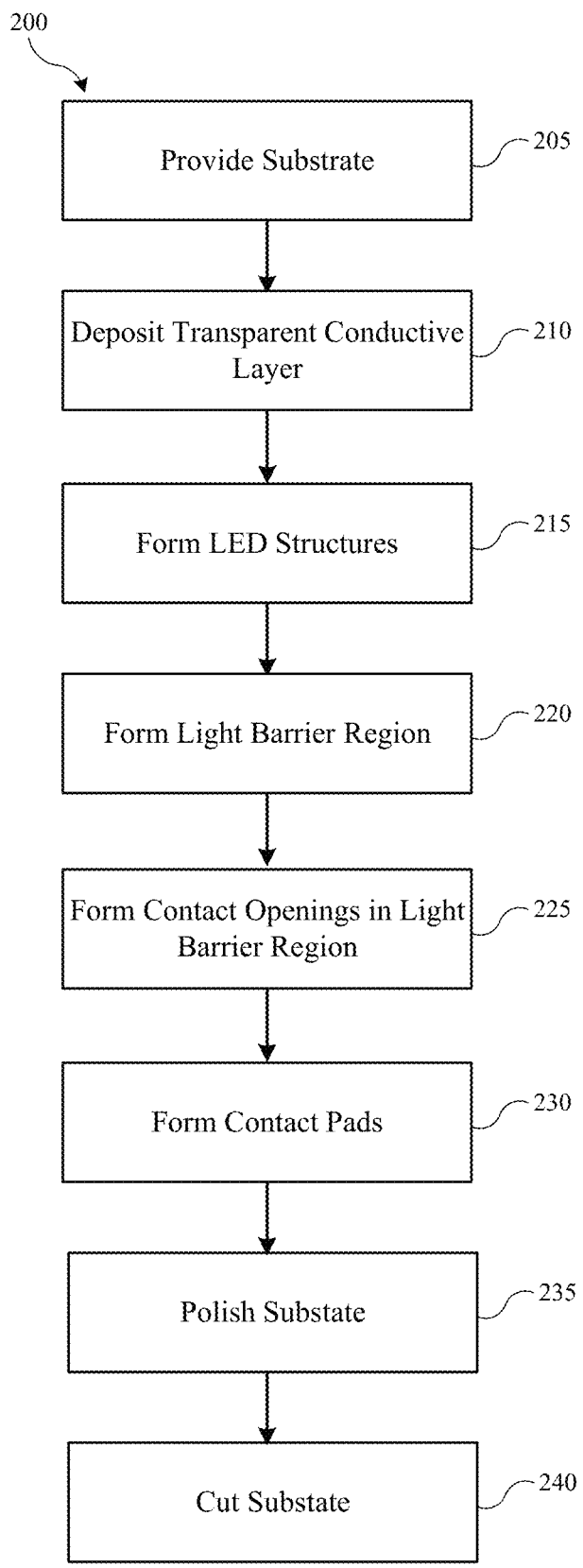
FIG. 2A shows exemplary operations in a method of forming LED semiconductor devices according to some embodiments of the present technology.
Figure 2B:
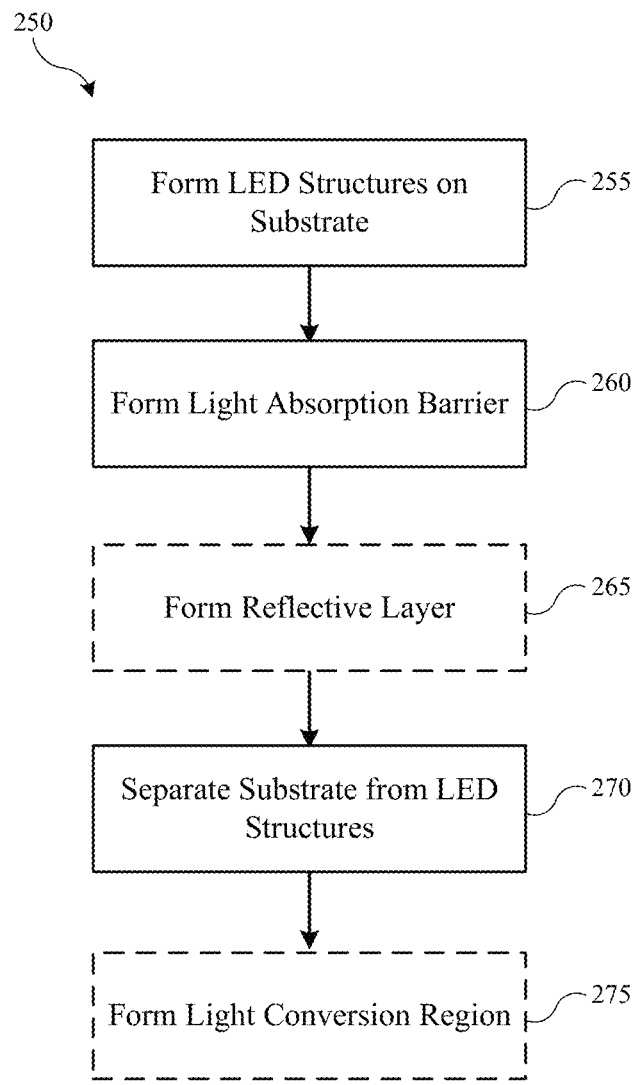
FIG. 2B shows exemplary operations in another method of forming LED semiconductor devices according to some embodiments of the present technology.

System 100, or more specifically chambers incorporated into system 100 or other processing systems, may be used to produce semiconductor LED structures according to some embodiments of the present technology. FIG. 2A and FIG. 2B show exemplary operations in methods 200 and 250 of forming a LED semiconductor structure according to some embodiments of the present technology. Methods 200 and 250 may be performed in one or more processing chambers, such as chambers incorporated in system 100, for example. Methods 200 and 250 may or may not include one or more operations prior to the initiation of the method, including front-end processing, deposition, etching, polishing, cleaning, or any other operations that may be performed prior to the described operations. The methods may include a number of optional operations, which may or may not be specifically associated with some embodiments of methods according to the present technology.

FIG. 2A shows exemplary operations in a method 200 of forming a LED semiconductor structure according to embodiments of the present technology. Method 200 includes providing an LED substrate at operation 205. As noted below, in embodiments, the LED substrate may be made of sapphire or another LED substrate material. A transparent conductive layer may be deposited on the LED substrate material at operation 210. In embodiments, the transparent conductive layer may comprise indium-tin-oxide or another transparent conductive material. The layers of material that form the LED structures may be deposited and etched to form the LED structures at operation 215. As discussed below, in embodiments, these layers of materials may include an n-doped GaN layer, layers for a multi-quantum-well (MQW) structure, and a p-doped GaN layer, among other layers. In further embodiments, the layers of material in the LED structures may be blanket deposited on the transparent conductive layer and then patterned etched to form the LED structures.

In the embodiment described in method 200, the method includes the formation of a light barrier region on the LED structures at operation 220. As described below, embodiments of the light barrier region include one or more layers of dielectric material that block the passage of highly energetic short-wavelength light while permitting the passage of light generated by the LED structures. Also, in the embodiment described in method 200, contact openings may be formed in the light barrier region at operation 225. Electrically conductive contact pads for the n-doped and p-doped portions of the LED structures may be formed through the contact openings at operation 235. The LED substrate may then be polished at operation 235 and cut into LED substrate chips at operation 240.

In embodiments, the LED substrate chips may be joined directly to a backplane substrate, and the LED substrate layer is removed from the joined structure by a laser liftoff technique. In additional embodiments, the LED substrate chips may first be bonded with a polymer layer. The combined LED substrate chips and polymer layer may then be joined to another substrate layer, such as a backplane substrate layer. In yet additional embodiments, the LED substrate may be removed from the LED substrate chips by a laser liftoff technique before or after the combined LED substrate chips and polymer layer are joined to another substrate layer. The light barrier region in the LED substrate chips prevents highly energetic short-wavelength light used in the laser liftoff technique from damaging the polymer material in the polymer layer. In embodiments where the combined LED substrate chips and polymer layer are joined to another substrate layer before the laser liftoff technique, the light barrier region prevents the laser liftoff light from damaging both the polymer layer and the additional substrate layer.

FIG. 2B shows exemplary operations in another method 250 of forming a LED semiconductor structure according to some embodiments of the present technology. Method 250 describes operations to form embodiments of semiconductor structures shown in a simplified schematic form in FIG. 3A, FIG. 3B, FIG. 4, FIG. 5, and FIG. 6, the illustrations of which will be described in conjunction with the operations of method 250. It should be understood that FIG. 3A, FIG. 3B, FIG. 4, FIG. 5, and FIG. 6, illustrate only partial schematic views with limited details, and in some embodiments, a substrate may contain any number of semiconductor sections having aspects as illustrated in the figures, as well as alternative structural aspects that may still benefit from any of the aspects of the present technology.

In embodiments, method 250 includes forming an LED structure on a substrate in operation 255. Embodiments of the operation include providing a substrate such as the substrates 312, 412, and 512 shown in FIG. 3A, FIG. 3B, FIG. 4, and FIG. 5. In embodiments, the substrates 312, 412, and 512, may be formed from a material that is characterized by a room temperature (~23° C.) bandgap between a valence band and a conduction band that permits the transmission of ultraviolet light used in a laser liftoff operation. In additional embodiments, the substrate material may be characterized by a room temperature bandgap greater than or about 5 electron volts (eV), greater than or about 6 eV, greater than or about 7 eV, greater than or about 8 eV, greater than or about 9 eV, greater than or about 10 eV or more. In further embodiments, the substrate material may be sapphire (bandgap=9.9 eV) or quartz (bandgap~10 eV). In still further embodiments, the substrate material may be made of sapphire that is either planar or patterned. In embodiments, a planar sapphire substrate may be characterized by a smooth interface between the substrate and the LED structure formed on the substrate. In additional embodiments, a patterned sapphire substrate may include one or more patterned structures such as dome structure, a pyramid structure, or a column structure, among other patterned structures. In still additional embodiments, the individual units of the patterned structures may be characterized by a longest dimension of less than or about 3000 nm, less than or about 2000 nm, less than or about 1000 nm, less than or about 500 nm, less than or about 250 nm, or less. In yet further embodiments, the substrates 312, 412, 512, may be characterized by a thickness of greater than or about 200 µm, greater than or about 500 µm, greater than or about 750 µm, greater than or about 1000 µm, greater than or about 1250 µm, greater than or about 1500 µm, or more.

Figure 3A:
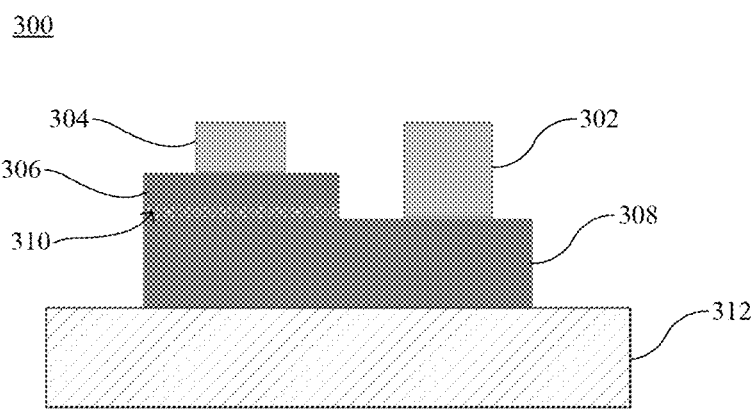
FIG. 3A and FIG. 3B show a cross-sectional views of a semiconductor LED structure according to embodiments of the present technology.
Figure 3B:
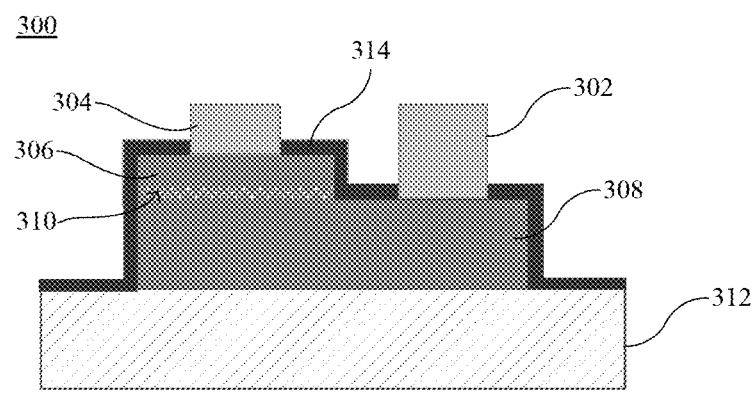

Embodiments of operation 255 may also include forming LED structures on the substrates 312, 412, and 512. These LED formation operations may include forming an n-doped gallium-and-nitrogen-containing layer on a substrate. For example, FIG. 3A and FIG. 3B show an n-doped gallium nitride (GaN) layer 308 formed on the substrate 312. In additional embodiments, the n-doped layer 308 may include one or more of gallium nitride (GaN), aluminum-indium-gallium-nitride (AlInGaN), indium-gallium-nitride (InGaN), and aluminum-gallium nitride (AlGaN). In further embodiments, the n-doped layer 308 may include gallium-free, indium-and-nitride materials such as indium nitride (InN), and aluminum-indium-nitride (AlInN), among other gallium-free nitride materials.

Embodiments of forming an LED structure at operation 255 may further include forming layers of a multi-quantum-well (MQW) structure on the n-doped layer of the LED structure. For example, FIG. 3A and FIG. 3B show an MQW structure 310 formed on n-doped layer 308. In embodiments, the MQW structure 310 may include one or more quantum well layers formed on the n-doped layer 308. In additional embodiments, the MQW structure 310 may include one more layers of an InGaN-containing material deposited on a gallium-and-nitrogen-containing n-doped region 308 that may be collectively referred to as a InGaN/GaN-superlattice (SL). In embodiments, the number of quantum well layers in the MQW structure 310 may be greater than or about 2 quantum well layers, greater than or about 3 quantum well layers, greater than or about 4 quantum well layers, greater than or about 5 quantum well layers, greater than or about 6 quantum well layers, greater than or about 7 quantum well layers, greater than or about 8 quantum well layers, greater than or about 9 quantum well layers, greater than or about 10 quantum well layers, or more. In still further embodiments, the quantum well layers may include indium, gallium, and nitrogen (e.g., InGaN). In yet further embodiments, the quantum well layers may be characterized by a thickness greater than or about 1 nm, greater than or about 2 nm, greater than or about 3 nm, greater than or about 4 nm, greater than or about 5 nm, or more.

Embodiments of forming an LED structure at operation 255 may still further include forming a p-doped layer on the multi-quantum-well (MQW) structure. For example, FIG. 3A and FIG. 3B show a p-doped layer 306 formed on the MQW structure 310. In embodiments, the p-doped layer 306 may be made from one or more of gallium nitride (GaN), aluminum-indium-gallium-nitride (AlInGaN), indium-gallium-nitride (InGaN), and aluminum-gallium nitride (AlGaN). In further embodiments, the p-doped layer 306 may include gallium-free, indium-and-nitride materials such as indium nitride (InN), and aluminum-indium-nitride (AlInN), among other gallium-free nitride materials.

In embodiments, the LED structures, including the n-doped layer, MQW structure, and p-doped layer, may be formed by first depositing blanket layers of the materials on the substrates 312, 412, and 512, and then patterning and etching the discrete structures on the substrates. In additional embodiments, discrete structures may be grown directly on the substrates 312, 412, and 512. In further embodiments, gallium-and-nitrogen-containing material may be deposited using metal-organic chemical vapor deposition (MOCVD) of gallium-and-nitrogen-containing material on portions of the substrates 312, 412, and 512, that have been exposed by a patterning layer (not shown). In yet more embodiments, the MOCVD may include supplying deposition precursors to the exposed portions of the substrates 312, 412, and 512. In embodiments, the deposition precursors may include one or more alkyl gallium compounds such as trimethylgallium and triethylgallium, among other gallium compounds. In additional embodiments, the deposition precursors may also include ammonia ($NH_3$) to provide the nitrogen component of a gallium-and-nitrogen-containing material. In still additional embodiments, the components of the LED structures may be formed using molecular beam epitaxy (MBE).

Embodiments of forming an LED structure at operation 255 may additionally include forming contact pads on the n-doped and p-doped layers of the LED structures. For example, FIG. 3A and FIG. 3B show n-pad 302 in contact with n-doped layer 308 and p-pad 304 in contact with p-doped layer 306. The contact pads may be made from one or more electrically conductive materials such as copper, aluminum, tungsten, chromium, nickel, silver, gold, platinum, palladium, titanium, tin, and/or indium, among other conductive materials.

Figure 4:
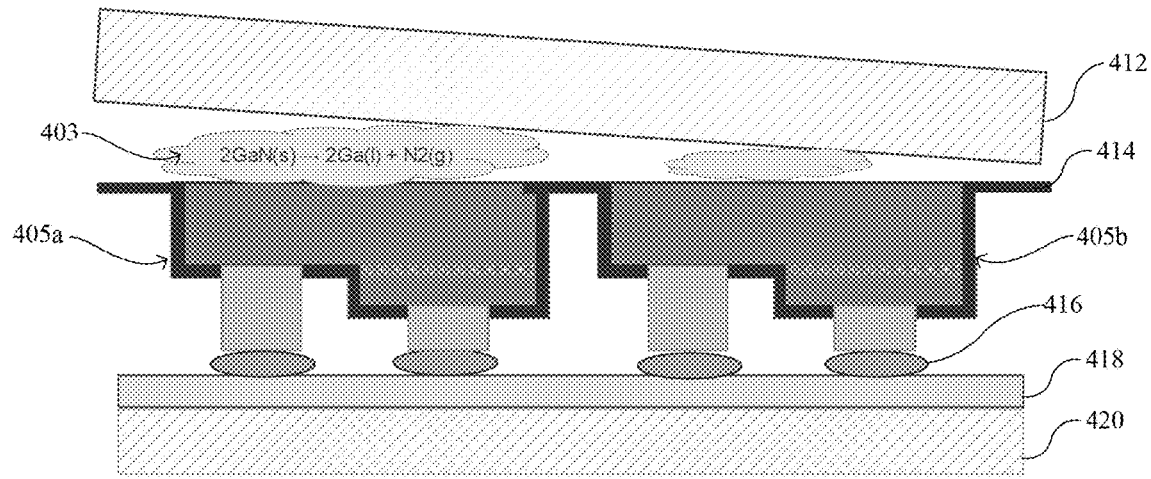
FIG. 4 shows an additional cross-sectional view of a semiconductor LED structure undergoing a substrate separation according to embodiments of the present technology.
Figure 5:
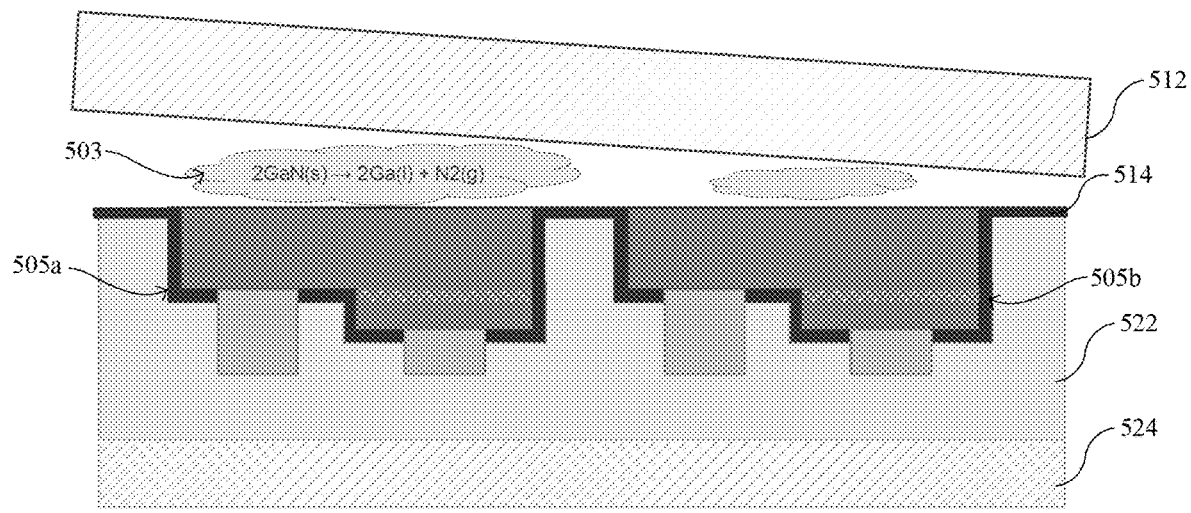
FIG. 5 shows a cross-sectional view of another semiconductor LED structure undergoing a substrate separation according to embodiments of the present technology.

Method 250 may further include forming a light absorption barrier on the LED structures and LED substrate at operation 260. In embodiments, portions of the light absorption barrier may be formed directly on the substrates 312, 412, and 512, between the LED structures. For example, FIG. 4 and FIG. 5 show light absorption barriers 414 and 514 formed between LED structures 405a-b and 505a-b, respectively. The light absorption barrier prevents energetic ultraviolet light from penetrating through the light absorption barrier between LED structures and damaging underlying materials such as backplane substrates and polymer layers. For example, in the embodiment shown in FIG. 4, the light absorption barrier 414 prevents energetic ultraviolet light transmitted through substrate 412 from penetrating through the region between the LED structures 405a-b and reaching the underlying backplane layers 418 and 420. In the embodiment shown in FIG. 5, the light absorption barrier 514 prevents energetic ultraviolet light transmitted through substrate 512 from penetrating through the region between the LED structures 505a-b and reaching the polymer material 522.

In embodiments, the light absorption barriers 314, 414, 514, and 614, shown in FIG. 3B, FIG. 4, FIG. 5, and FIG. 6, may include one or more layers of material that can absorb the energetic ultraviolet light used in a laser liftoff operation and transmit light at longer wavelengths, including the wavelengths of light emitted by the LED structures. In additional embodiments, the light absorption barrier may absorb energetic ultraviolet light and wavelengths less than or about 350 nm, less than or about 340 nm, less than or about 330 nm, less than or about 320 nm, less than or about 310 nm, less than or about 300 nm, less than or about 290 nm, less than or about 280 nm, less than or about 270 nm, less than or about 260 nm, less than or about 250 nm, or less. In further embodiments, the light absorption barrier may absorb the energetic ultraviolet light reaching the barrier at greater than or about 50%, greater than or about 60%, greater than or about 70%, greater than or about 80%, greater than or about 90%, greater than or about 92.5%, greater than or about 95%, greater than or about 99%, or more. In still further embodiments, the light absorption barrier may transmit less-energetic ultraviolet light and visible light at wavelengths greater than or about 350 nm, greater than or about 360 nm, greater than or about 370 nm, greater than or about 380 nm, greater than or about 390 nm, greater than or about 400 nm or more. In more embodiments, the light absorption barrier may transmit the longer-wavelength light reaching the barrier at transmittance levels greater than or about 50%, greater than or about 60%, greater than or about 70%, greater than or about 80%, greater than or about 90%, greater than or about 92.5%, greater than or about 95%, greater than or about 99%, or more.

In additional embodiments, the light absorption barrier may be made from one or more layers of dielectric materials. In further embodiments, the dielectric materials may be selected from silicon oxide, silicon nitride, titanium oxide, titanium nitride, germanium oxide, tantalum oxide, tantalum nitride, manganese oxide, niobium oxide, antimony oxide, indium-tin-oxide, lanthanum oxide, yttrium oxide, zirconium oxide, aluminum oxide, aluminum nitride, hafnium oxide, and magnesium fluoride, among other dielectric materials. In still further embodiments, the light absorption barrier may be a multilayer barrier that includes two or more layers, three or more layers, four or more layers, five or more layers, six or more layers, seven or more layers, eight or more layers, nine or more layers, ten or more layers, or more. In yet additional embodiments, the light absorption barrier may have a thickness greater than or about 25 nm, greater than or about 50 nm, greater than or about 75 nm, greater than or about 100 nm, greater than or about 125 nm, greater than or about 150 nm, greater than or about 175 nm, greater than or about 250 nm, greater than or about 225 nm, greater than or about 250 nm, greater than or about 275 nm, greater than or about 300 nm, greater than or about 325 nm, greater than or about 350 nm, greater than or about 375 nm, greater than or about 400 nm, or more.

Figure 6:
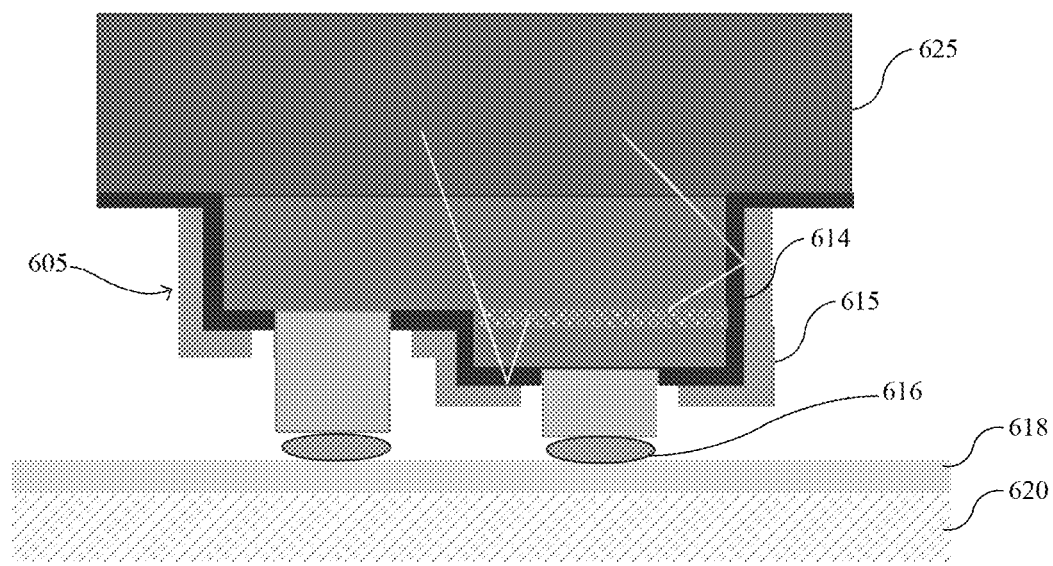
FIG. 6 shows a cross-sectional view of a semiconductor LED structure according to additional embodiments of the present technology Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

Method 250 may optionally include forming a reflective layer on the light absorption barrier at operation 265. In embodiments, the reflective layer may be operable to reflect light emitted from the LED structure and transmitted through the light absorption barrier in a useful direction for the display of images on an LED display. FIG. 6 shows an embodiment of a reflective layer 615 formed on light absorption barrier 614 that is operable to reflect light emitted by the MQW structure of the LED structure 605 in a direction towards the light conversion structure 625 where the light emitted by the LED structure is converted into visible light for an LED display. In additional embodiments, the reflective layer 615 may be made of one or more reflective metals such as aluminum, silver, or copper. In still additional embodiments, the reflective layer may have a thickness greater than or about 50 nm, greater than or about 100 nm, greater than or about 150 nm, greater than or about 200 nm, greater than or about 250 nm, greater than or about 300 nm, or more. In yet further embodiments, the reflective layer 615 may be formed on the light absorption barrier 614 by sputtering, physical vapor deposition, chemical vapor deposition, and electroplating, among other formation techniques.

In additional embodiments, the light absorption barrier 614 in contact with the reflective layer 615 may increase the reflectivity of the reflective layer at the wavelengths of light emitted by the LED structure 605. For example, the reflective layer 615 may be characterized by a percentage reflectance without the light absorption barrier 614 of less than or about 92%, less than or about 91%, less than or about 90%, less than or about 89%, less than or about 88%, less than or about 87%, less than or about 86%, less than or about 85%, or less. On the other hand, the reflective layer 615 may be characterized by a percentage reflectance with the light absorption barrier 614 of greater than or about 92%, greater than or about 93%, greater than or about 94%, greater than or about 95%, greater than or about 96%, greater than or about 97%, greater than or about 98%, greater than or about 99%, or more. In still further examples, the increase in the percentage reflection of a reflective layer in the presence of a light absorption barrier may be greater than or about 2.5%, greater than or about 5%, greater than or about 7.5%, greater than or about 10%, or more.

Method 250 may yet also include separating the LED substrate from the LED structures at operation 270. In embodiments, this separation operation may include a laser liftoff operation that uses energetic ultraviolet light to photodissociate the bonding between the LED substrate and surfaces of the LED structures in contact with the substrate. In the embodiments shown in FIG. 4 and FIG. 5, the energetic ultraviolet light photodissociates gallium nitride (GaN) in the n-doped based layers of the LED structures 405$a$-$b$ and 505$a$-$b$ that are in contact with the LED substrates 412 and 512. The photodissociation of the GaN material creates liquid gallium (Ga) and nitrogen gas 403, 503. The loss of solid GaN material and increasing build-up in the pressure of the nitrogen gas creates a separation between the LED structures 405$a$-$b$ and 505$a$-$b$ and the substrate layers 412 and 512. In some embodiments, little or no added force is required to separate the LED structures from the substrate layers.

As noted above, in embodiments, portions of a light absorption barrier 414, 514, are formed on the substrate 412, 512, between the LED structures 405$a$-$b$, 505$a$-$b$. In embodiments, the light absorption barrier is formed over the LED structures, and no portion of the light absorption barrier is formed between the interface of the base region of the LED structure and the substrate upon which the LED structure is formed. This permits the energetic ultraviolet light transmitted through the substrate layer to be absorbed by the material in the base regions of the LED structures and by the light absorption barrier formed directly on the substrate between the LED structures. The energetic ultraviolet light absorbed by the light absorption barriers 414, 514, and 614, prevent that light from damaging the underlying materials and components of LED semiconductor structures 400, 500, and 600 shown in FIG. 4, FIG. 5, and FIG. 6. In embodiments, these include the solder bumps 416, 616, backplane contacts 418, 618, and backplane substrates 420, 620 shown in FIG. 4 and FIG. 6. They also include the polymer material 522 and temporary substrate 524 shown in FIG. 5.

In embodiments, the energetic ultraviolet light used in the separation operation 270 may be characterized by a peak intensity photon energy of greater than or about 4 eV, greater than or about 4.1 eV, greater than or about 4.2 eV, greater than or about 4.3 eV, greater than or about 4.4 eV, greater than or about 4.5 eV, greater than or about 4.6 eV, greater than or about 4.7 eV, greater than or about 4.8 eV, greater than or about 4.9 eV, greater than or about 5 eV, greater than or about 5.1 eV, greater than or about 5.2 eV, greater than or about 5.3 eV, greater than or about 5.4 eV, greater than or about 5.5 eV, or more. In additional embodiments, the energetic ultraviolet light may be characterized by a peak intensity wavelength of less than or about 350 nm, less than or about 340 nm, less than or about 330 nm, less than or about 320 nm, less than or about 310 nm, less than or about 300 nm, less than or about 290 nm, less than or about 280 nm, less than or about 270 nm, less than or about 260 nm, less than or about 250 nm, less than or about 240 nm, less than or about 230 nm, less than or about 220 nm, less than or about 210 nm, less than or about 200 nm, or less. In still further embodiments, the energetic ultraviolet light may be generated by an excimer laser characterized by a peak emission wavelength of 157 nm ($F_2$), 193 nm (ArF), 248 nm (KrF), 282 nm (CeBr), 308 nm (XeCl), or 351 nm (XeF), among other peak emission wavelengths. In additional embodiments, the energetic ultraviolet light may be generated by a solid-state laser (e.g., $Nd^{3+}$-YAG laser with frequency doubling) characterized by a peak emission wavelength of 300 nm or less (e.g., 266 nm).

Method 250 may also optionally include forming a light conversion region at operation 275. In embodiments, a light conversion region may be formed on an LED structure and convert the light emitted by the LED structure into a longer wavelength of light that is transmitted from the pixel or subpixel of the LED display. For example, FIG. 6 shows a light conversion region 625 formed on LED structure 605. The light conversion region 625 absorbs the light emitted by the LED structure 605 and emits light at a longer wavelength from the LED display. In embodiments, the light emitted by the LED structure 605 may be characterized by a peak intensity wavelength less than or about 425 nm, less than or about 415 nm, less than or about 405 nm, less than or about 395 nm, less than or about 385 nm, less than or about 375 nm, less than or about 365 nm, less than or about 355 nm, or less. This light may be absorbed by the light conversion region 625, which causes the region to emit a longer wavelength light characterized by a peak intensity wavelength greater than or about 400 nm, greater than or about 425 nm, greater than or about 500 nm, greater than or about 525 nm, greater than or about 550 nm, greater than or about 575 nm, greater than or about 600 nm, greater than or about 625 nm, greater than or about 650 nm, greater than or about 675 nm, greater than or about 700 nm, or more.

In embodiments, the light conversion layer 625 may be a quantum-dot layer. In additional embodiments, the quantum dot layer may be operable to convert a shorter wavelength of light from the LED structure 605 into one of red, green, or blue light. Additional quantum-dot-layers may be formed on other LED structures (not shown) to convert the shorter wavelength of light emitted by the LED structure into another of the red, green, and blue colored light. In further embodiments, combinations of three quantum-dot-layers on three LED structures may form a LED pixel that includes subpixels operable to emit red, green, and blue light. In more embodiments, sequential operations may form a red quantum dot layer in one of the subpixels of each LED pixel, then form a green quantum dot layer in another one of the subpixels, and then form a blue quantum dot layer in still another one of the subpixels. Following the formation of the blue quantum dot, each LED pixel in the array of LED pixels includes red, green, and blue subpixels.

In additional embodiments, the formation of a quantum dot layer operable to emit a particular color of visible light (e.g., red, green, or blue light) in a LED subpixel may include dispensing a photo-curable fluid over the high-pixel-density LED structure, activating one of the subpixels in each LED pixel in the array of LED pixels to illuminate and cure the photo-curable fluid over that subpixel, and removing the uncured photo-curable fluid from the other subpixels that were not activated. These formation operations may be repeated for the subpixels emitting each color of light in the array of LED pixels. In embodiments, the formation operation self-aligns the quantum-dot layers with the activated subpixels of the LED pixels throughout the array of LED pixels. No precision alignment operations are required to form the quantum-dot layers in the proper group of subpixels. The self-alignment of the quantum-dot layers is increasingly beneficial as the size of the subpixels decreases and the pixel density increases.

In embodiments, the photo-curable fluid may include one or more cross-linkable compounds, a photo-initiator, and a color conversion agent. In additional embodiments, the cross-linkable compounds may include monomers that form a polymer when cured. In more embodiments, the monomers may include acrylate monomers, methacrylate monomers, and acrylamide monomers. In yet more embodiments, the cross-linkable compounds may include a negative photoresist material such as SU-8 photoresist. In further embodiments, the photo-initiator may include phosphine oxide compounds and keto compounds, among other kinds of photo-initiator compounds that generate radicals that initiate the curing of unsaturated compounds when excited by ultraviolet light. Commercially available photo-initiator compounds include Irgacure 184, Irgacure 819, Darocur 1173, Darocur 4265, Darocur TPO, Omnicat 250, and Omnicat 550, among other photo-initiators. In still further embodiments, the color conversion agent may include a quantum dot material that can absorb shorter wavelength (i.e., more energetic) light from the LED structure and emit longer wavelength light corresponding to the color of light emitted by the subpixel. In embodiments, these quantum-dot materials may include nanoparticles made of one or more kinds of inorganic semiconductor materials such as indium phosphide, silver-indium-gallium-sulfur (AIGS), cadmium selenide, cadmium telluride, zinc selenide, zinc sulfide, silicon, silicates, and graphene, and doped inorganic oxides, among other semiconductor materials.

Embodiments of the present technology like method 250 includes operations to fabricate LED semiconductor structures with less damage to the backplane components of the structures caused by laser liftoff operations. These operations include the formation of a light absorption barrier on the regions of the removable LED substrate between the LED structures formed on the substrate. The light absorption barrier absorbs the energetic ultraviolet light that would otherwise penetrate through the inter-device regions and photoionize material in the backplane substrate. In additional embodiments, the light absorption barrier, which absorbs energetic ultraviolet light, can improve the transmission and reflectance of less energetic ultraviolet and visible light. In embodiments of the present technology that include LED semiconductor structures that include both a light absorption barrier and a reflective layer, the light absorption barrier can increase the reflective layer's percentage reflection of light emitted by the LED structure by several percent. Thus, embodiments of the present technology provide fabrication methods for LED displays with reduced damage from laser liftoff operations and increased emission of useful light from the improved reflectivity of combined light absorption barriers and reflective layers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either of the limits, both of the limits, or neither of the limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
    forming a group of LED structures on a substrate layer to form a patterned LED substrate, wherein each LED structure of the group of LED structures includes contact pads;
    forming a light absorption barrier on the patterned LED substrate, wherein forming the light absorption barrier leaves exposed at least a portion of the contact pads, and the light absorption barrier is operable to absorb greater than or about 50% of light at wavelengths shorter than or about 300 nm;
    forming a reflective layer on the light absorption barrier, wherein the light absorption barrier is between the LED structures and the reflective layer, the reflective layer is operable to reflect light emitted from the LED structures that passes through the light absorption barrier, and forming the reflective layer exposes the at least a portion of the contact pads;
    exposing the patterned LED substrate to light, wherein the light is absorbed by surfaces of the LED structures in contact with the substrate layer and the light absorption layer; and
    separating the LED structures from the substrate layer, wherein bonding between the LED structures and the substrate layer has been weakened by the absorption of the light by the surfaces of the LED structures in contact with the substrate layer.

2. The semiconductor processing method of claim 1, wherein the group of LED structures comprises gallium-and-nitrogen-containing material, and wherein the gallium-and-nitrogen-containing material generates nitrogen gas when exposed to the light at the surfaces of the LED structures in contact with the substrate layer.

3. The semiconductor processing method of claim 1, wherein the substrate layer comprises sapphire.

4. The semiconductor processing method of claim 1, wherein the light is characterized by a peak intensity wavelength less than or about 300 nm.

5. The semiconductor processing method of claim 1, wherein the light absorption barrier comprises one or more layers of dielectric material, and wherein the dielectric material is characterized by a room-temperature bandgap of greater than or about 4.3 eV.

6. The semiconductor processing method of claim 1, wherein the light absorption barrier is operable to transmit greater than or about 50% of light at wavelengths greater than or about 350 nm.

7. The semiconductor processing method of claim 1, wherein the semiconductor further comprises a backplane substrate bonded to the group of LED structures opposite the substrate layer.

8. The semiconductor processing method of claim 7, wherein the light absorption barrier prevents the light exposing the patterned LED substrate from reaching the backplane substrate.

9. The semiconductor processing method of claim 1, wherein forming the group of LED structures on the substrate layer to form the patterned LED substrate comprises:
    forming an n-doped layer on the substrate layer, wherein the n-doped layer is a gallium-and-nitrogen-containing material;
    forming a multi-quantum-well (MQW) structure layer on the n-doped gallium-and-nitrogen-containing layer;
    forming a p-doped layer on the MQW structure layer;
    etching the n-doped layer, the MQW structure layer, and the p-doped layer to form an exposed portion of the n-doped layer and an exposed portion of the p-doped layer;
    forming an n-pad of the contact pads on the exposed portion of the n-doped layer; and
    forming a p-pad of the contact pads on the exposed portion of the p-doped layer.

10. The semiconductor processing method of claim 1, wherein the light absorption barrier has a thickness of between 25 nm and 400 nm.

11. The semiconductor processing method of claim 1, wherein the reflective layer has a thickness of between 50 nm and 300 nm.

12. The semiconductor processing method of claim 1, wherein the light absorption barrier comprises one or more layers of a first dielectric material and one or more layers of a second dielectric material, wherein the first dielectric material and the second dielectric material are different materials, wherein the first dielectric material and the second dielectric material are selected from the group comprising silicon oxide, silicon nitride, titanium oxide, titanium nitride, germanium oxide, tantalum oxide, tantalum nitride, manganese oxide, niobium oxide, antimony oxide, indium-tin-oxide, lanthanum oxide, yttrium oxide, zirconium oxide, aluminum oxide, aluminum nitride, hafnium oxide, and magnesium fluoride.

13. The semiconductor processing method of claim 1, wherein the reflective layer comprises a metal selected from the group comprising aluminum, silver, and copper.

14. The semiconductor processing method of claim 1, further comprising forming a light-conversion region in contact with at least one of the LED structures, wherein the light-conversion region is operable to absorb light generated by the LED structures and emit converted light characterized by a longer peak intensity wavelength than light generated by the LED structures.

15. The semiconductor processing method of claim 14, wherein the light-conversion region is a quantum dot layer operable to convert a shorter wavelength of light generated by the LED structures into one of red, green, or blue light.

16. A semiconductor processing method comprising:
   forming an LED structure on a substrate layer, wherein the LED structure includes contact pads;
   forming a first portion of a light absorption barrier on the LED structure and the substrate layer, wherein forming the light absorption barrier leaves exposed at least a portion of the contact pads, and the light absorption barrier is operable to absorb greater than or about 50% of light at wavelengths shorter than or about 300 nm;
   forming at least one additional portion of the light absorption barrier on the first portion of the light absorption barrier;
   forming a reflective layer on the light absorption barrier, wherein the light absorption barrier is between the LED structure and the reflective layer, the reflective layer is operable to reflect light emitted form the LED structure that passes through the light absorption barrier, and forming the reflective layer exposes that at least a portion of the contact pads;
   exposing the substrate layer to ultraviolet light, wherein the ultraviolet light is absorbed by exposed portions of the light absorption barrier; and
   separating the LED structure from the substrate layer.

17. The semiconductor processing method of claim 16, wherein the first portion of the light absorption barrier comprises a first dielectric material selected from a group comprising silicon oxide, silicon nitride, titanium oxide, titanium nitride, germanium oxide, tantalum oxide, tantalum nitride, manganese oxide, niobium oxide, antimony oxide, indium-tin-oxide, lanthanum oxide, yttrium oxide, zirconium oxide, aluminum oxide, aluminum nitride, hafnium oxide, and magnesium fluoride.

18. The semiconductor processing method of claim 17, wherein the at least one additional portion of the light absorption barrier comprises a second portion that includes a second dielectric material that is different than the first dielectric material.

19. The semiconductor processing method of claim 16, wherein the ultraviolet light is less than or about 300 nm.

20. The semiconductor processing method of claim 16, wherein a combination of the light absorption barrier and the reflective layer reflect greater than or about 92% of light emitted by the LED structures, wherein light emitted by the LED structures has wavelengths greater than or about 350 nm.

* * * * *